(12) United States Patent
Uchiyama et al.

(10) Patent No.: US 6,817,073 B2
(45) Date of Patent: Nov. 16, 2004

(54) METHOD OF MANUFACTURING A THIN FILM PIEZOELECTRIC ELEMENT

(75) Inventors: Hirokazu Uchiyama, Higashiosaka (JP); Yuko Ogawa, Katano (JP); Hiroyuki Kita, Osaka (JP)

(73) Assignee: Matsushita Electric Industrial Co., Ltd. (JP)

( * ) Notice: Subject to any disclaimer, the term of this patent is extended or adjusted under 35 U.S.C. 154(b) by 0 days.

(21) Appl. No.: 10/287,797

(22) Filed: Nov. 5, 2002

(65) Prior Publication Data

US 2003/0155845 A1 Aug. 21, 2003

(30) Foreign Application Priority Data

Nov. 5, 2001 (JP) ........................... 2001-339109

(51) Int. Cl.[7] ................. H04R 17/00; B44C 1/22; B32B 31/00
(52) U.S. Cl. ................. 29/25.35; 29/831; 29/846; 29/DIG. 1; 29/DIG. 16; 29/423; 216/20; 216/33; 156/152; 156/247; 310/340; 310/365; 438/455
(58) Field of Search ................. 29/25.35, 831, 29/846, DIG. 1, DIG. 16, 423; 216/13, 20, 33, 36; 156/152, 247; 310/312, 365, 340; 438/455, 107

(56) References Cited

U.S. PATENT DOCUMENTS

| 6,645,830 B2 | * | 11/2003 | Shimoda et al. | ............ 438/455 |
| 6,666,943 B2 | * | 12/2003 | Wada et al. | ............ 156/247 X |

FOREIGN PATENT DOCUMENTS

| JP | 1-277011 | * 11/1989 | ............... 29/25.35 |
| JP | 8-242023 | 9/1996 | |
| JP | 11-26733 | 1/1999 | |

* cited by examiner

Primary Examiner—A. Dexter Tugbang
(74) Attorney, Agent, or Firm—Parkhurst & Wendel, L.L.P.

(57) ABSTRACT

A method of manufacturing a thin film piezoelectric element, wherein main electrode layer, piezoelectric thin film, and opposed electrode layer respectively having specified shapes are first formed on first substrate and second substrate, and after that, the opposed electrodes are opposed and bonded to each other, and insulating resin layer is formed over the peripheral portion thereof, and then the second substrate is removed, the insulating resin layer is etched, and connecting electrode pad is formed, and finally, the first substrate is removed to obtain a completely separated thin film piezoelectric element. By this method, it is possible to improve the reproducibility of shapes and to prevent trouble such as shorting between the electrodes which hold the piezoelectric thin film, thereby making it possible to provide a thin film piezoelectric element that may assure high yield without variation in piezoelectric characteristics, and its manufacturing method.

9 Claims, 8 Drawing Sheets

METHOD OF MANUFACTURING A THIN FILM PIEZOELECTRIC ELEMENT

FIELD OF THE INVENTION

The present invention relates to a piezoelectric element used as an actuator or a sensor for fine positioning, and its manufacturing method.

BACKGROUND OF THE INVENTION

Recently, electromechanical elements such as micro-actuators are attracting attention. Such elements may realize very small and highly accurate component parts, and the productivity may be greatly improved by using a semiconductor process in the manufacture of same. Particularly, a micro-actuator using piezoelectric elements is now under development as an element for fine displacement of a scanning tunnel microscope and for fine positioning of a head slider of a magnetic disk recording and reproducing unit (hereinafter called a disk drive unit).

Conventionally, in a disk drive unit, a magnetic head for recording and reproducing information on a magnetic disk is mounted on a head slider and attached to an actuator arm. The actuator arm is driven by a voice coil motor (hereinafter called VCM) and positioned to a specified track position on the magnetic disk, thereby recording and reproducing information by the magnetic head. However, as the recording density is improved, it is now very difficult to assure sufficient accuracy in such a conventional method of positioning by VCM only. Accordingly, in addition to a positioning means by VCM, technical developments are now in progress to realize high-speed and highly accurate positioning by fine driving of a head slider with use of a fine positioning means using piezoelectric elements.

Thus, piezoelectric elements are expected to be applied in various ways. To meet the expectation, piezoelectric elements are required to be small-sized, able to render low voltage drive possible and to generate considerable displacement, and a method of manufacturing thin film is now examined for the manufacture of such elements. In a thin film manufacturing method, there are two major problems. The first problem is that in order to obtain a piezoelectric thin film having excellent piezoelectric characteristics, it is necessary to form the film on a substrate such as a silicon mono-crystalline substrate. Also, it is necessary to laminate piezoelectric films in order to obtain great piezoelectric displacement. Accordingly, such thin film is manufactured by using two sheets of substrate according to the following method. Piezoelectric thin film is first formed on each substrate, and then the piezoelectric thin films are bonded to each other. After that, one of the substrates is removed by etching, then the bonded and laminated piezoelectric thin film is exposed. After etching the exposed piezoelectric thin film to let it have a specified piezoelectric pattern, the other substrate is removed by etching, thereby manufacturing a thin film piezoelectric element. However, the laminated piezoelectric thin film is very thick and its etching is difficult, frequently causing electrical shorts.

The second problem, as described above, occurs because the manufactured piezoelectric element in final use is in a state of being completely separated from the substrate on which the film is formed. That is, since a thin film piezoelectric element manufactured by a thin film manufacturing method is very thin, if the thin film piezoelectric element is separated from the substrate, it becomes difficult to mount it on another substrate without damaging it, and impossible to set up an actuator for high mass-production.

With respect to the second problem, Japanese Laid-open Patent H11-26733 discloses a manufacturing method for making a transferring layer made up of a thin film device, such as thin film transistor array having reliable characteristics, on a quartz substrate or a heat resistant glass substrate, after which, the transferring layer is transferred onto a substrate which is inexpensive and excellent in impact resistance, thereby realizing a light-weight, hard-to-crack, and low-cost liquid crystal display unit. In this manufacturing method, the thin film device formed on a quartz substrate or a heat resistant glass substrate is transferred onto other substrate, and in order to easily separate the thin film device from the quartz substrate or the heat resistance glass substrate, it is necessary to firstly form a separative layer on the substrate. However, when a substrate with such a separative layer formed thereon is used, it is difficult to generate vertical orientation on the film surface in the case of piezoelectric thin film, and there arises a problem that good piezoelectric characteristics cannot be obtained.

SUMMARY OF THE INVENTION

The present invention is intended to solve the above problem. The object of the invention is to improve the reproducibility of shapes in etching of piezoelectric thin film and to prevent the generation of defects such as shorting between the electrodes holding the piezoelectric thin film in the manufacture of a thin film piezoelectric element with a two-layer configuration of piezoelectric thin film, in order to provide a thin film piezoelectric element which may assure low costs and high yield without variation in piezoelectric characteristics, and its manufacturing method.

A manufacturing method for thin piezoelectric elements of the present invention comprises forming a plurality of first thin film patterns on a first substrate, wherein a first piezoelectric thin film is held between a first main electrode layer and a first opposed electrode layer on the first substrate, and at least a part of the first main electrode layer disposed at the first substrate side is larger in shape than the first piezoelectric thin film and the first opposed electrode layer;

forming a plurality of second thin film patterns on a second substrate, wherein a second piezoelectric thin film is held between a second main electrode layer and a second opposed electrode layer on the first substrate, and the second piezoelectric thin film, the second main electrode layer, and the second opposed electrode layer are nearly same in shape as the first piezoelectric thin film;

forming a plurality of structures, integrated by bonding the first thin film pattern and the second thin film pattern opposed and positioned to each other so as to be placed one upon another, and an insulating resin layer for protecting the structures;

selectively removing only the second substrate in order to expose the plurality of structures protected by the insulating resin layer;

etching said insulating resin layer into a shape that covers a peripheral portion of the structure except a part of the first main electrode layer;

forming a connecting electrode pad for connecting the first main electrode layer, the first opposed electrode layer, the second main electrode layer, and the second opposed electrode layer to external equipment; and selectively removing only the first substrate.

By this manufacturing method, the steps of finishing the main electrode layer and the piezoelectric thin film into specified shapes can be individually performed in a state of being formed on the first substrate and the second substrate. Accordingly, in a step of wet etching, the shape of the piezoelectric thin film can be formed with good reproducibility. Also, in wet etching, it is possible to eliminate foreign matter that is liable to stick to side wall surfaces in dry etching, and to realize a thin film piezoelectric element which hardly causes electrical shorting trouble and is stabilized in characteristics. On the other hand, in dry etching, as compared with the case of etching piezoelectric thin film having a two-layer configuration, the reproducibility of pattern shapes is improved because only one layer is etched, and also foreign matter that sticks to side wall surfaces during etching can be greatly reduced, thereby realizing the reduction of electrical shorting trouble and the stabilization of piezoelectric characteristics.

DETAILED DESCRIPTION OF THE INVENTION

The preferred embodiments of the present invention will be described in the following with reference to the drawings. Incidentally, like numerals refer to like component parts throughout.

First Exemplary Embodiment

Figure 1:
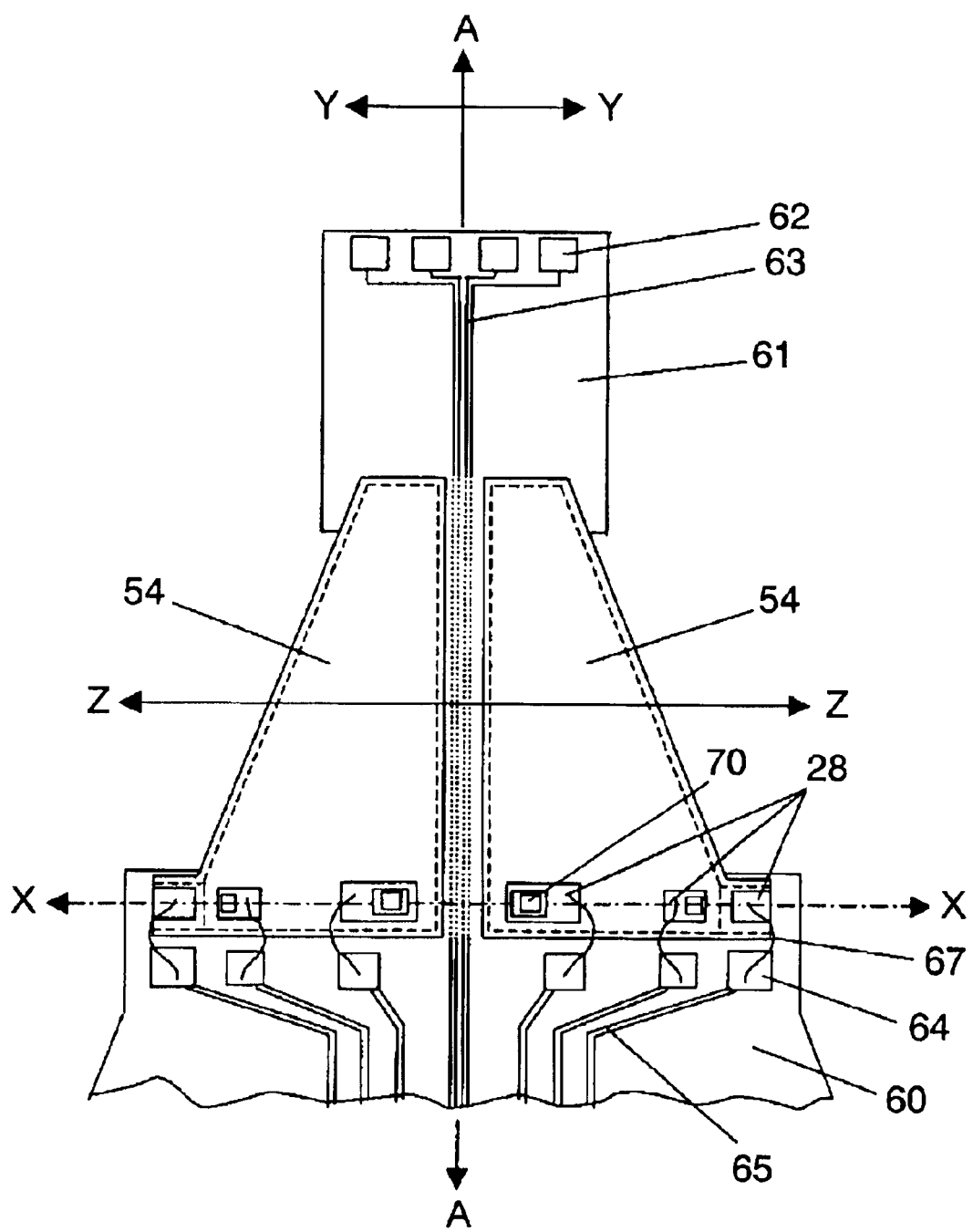
FIG. 1 is a plan view of an actuator with paired thin film piezoelectric elements made by the manufacturing method in the first preferred embodiment of the present invention.
Figure 2:
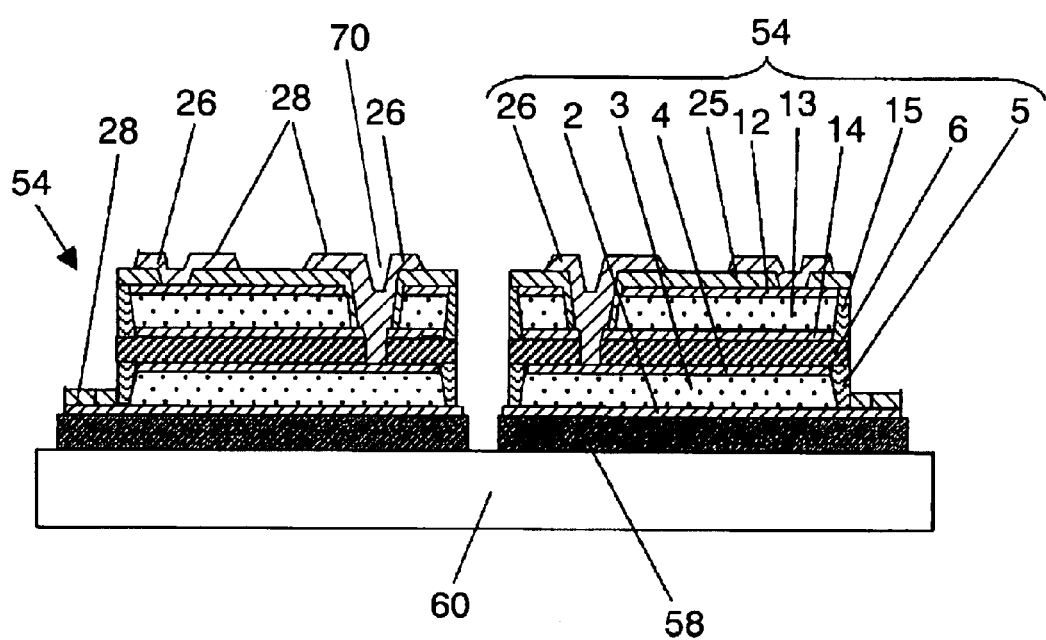
FIG. 2 is a sectional view along the X—X line shown in FIG. 1.

FIG. 1 is a plan view of an actuator with a pair of thin film piezoelectric elements made by the manufacturing method in the first exemplary embodiment. The actuator is used for highly accurate fine positioning of a head slider to a specified track position on a disk in a disk drive unit. The actuator is provided with two pieces of thin film piezoelectric elements 54, and these elements 54 are formed in symmetric relation to the A—A line, the lengthwise segment. FIG. 2 is a sectional view along the X—X line shown in FIG. 1. The configuration will be described in the following by using these figures.

As shown in FIG. 2, two pieces of piezoelectric elements 54 are same in structure. First piezoelectric thin film 3 held between first main electrode layer 2 and first opposed electrode layer 4 is bonded to second piezoelectric thin film 13 held between second main electrode layer 12 and second opposed electrode layer 14 by means of adhesive layer 6. Further, insulating resin layers 5, 15 are disposed at a side portion, and a structure described later is formed. The structure has via-hole 70 at the position shown in the figure. Through the via-hole 70 is formed connecting electrode layer 26 which serves to lead the first opposed electrode layer 4 and the second opposed electrode layer 14 out onto the surface of the thin film piezoelectric element 54 via insulating layer 25, thereby forming the thin film piezoelectric element 54.

The thin film piezoelectric element 54 is bonded and secured on the mounting substrate, flexure 60, by means of adhesive resin layer 58 formed on the first main electrode layer 2. Further, connecting electrode pad 28 formed by elongating the connecting electrode layer 26 up to the surface of the insulating layer 25 is connected, for example by wire lead 67, to piezoelectric electrode pad 64 disposed on the flexure 60, thereby forming an actuator for fine positioning of a magnetic head.

In FIG. 2, the connecting electrode layer 26 is not formed on the connecting electrode pad 28 of the first main electrode layer 2, and the first main electrode layer 2 itself serves as the connecting electrode pad 28, but it is also possible to form the connecting electrode layer 26 at the portion as well. Further, the insulating layer 25 is formed only in the region of the second main electrode layer 12, but it is also preferable to form the layer at the peripheral portion of the thin film piezoelectric element as well, that is, in the region where the insulating resin layers 5, 15 are formed.

As shown in FIG. 1, the flexure 60 includes a slider holding portion 61 which serves to hold a head slider (not shown) in the region further extended from the region where the thin film piezoelectric element 54 is bonded. The slider holding portion 61 is provided with a head electrode pad 62 for the connection to the wiring portion of a magnetic head (not shown) mounted on the head slider (not shown). From the head electrode pad 62, head electrode wiring 63 is arranged over the flexure 60 between the thin film piezoelectric elements 54 and is led to a connecting pad (not shown) for the connection to external equipment (not shown) the same as for piezoelectric electrode wiring 65 led from piezoelectric electrode pad 64.

Since the actuator is expanded at one side and contracted at the other when a reverse voltage is applied to each of the paired thin film piezoelectric elements 54, the slider holding portion 61, receiving the power then generated, is finely displaced to the right and left (in the direction of Y—Y line), and thereby, the magnetic head may be very accurately positioned to the specified track position on the disk (not shown).

The method of manufacturing the thin film piezoelectric element 54 will be described in the following with reference to FIG. 3A to FIG. 6B. The sectional portion along the Z—Z line in FIG. 1 is shown in the explanatory diagrams of FIG. 3A to FIG. 6B.

FIG. 3A to FIG. 3D are explanatory diagrams showing the main steps for forming the first piezoelectric thin film 3, the first main electrode layer 2, and the first opposed electrode layer 4 and for finishing them into specified shapes on the first substrate. Also, FIG. 4A to FIG. 4D are explanatory diagrams showing the main steps for film forming and finishing into specified shapes similarly on the second substrate.

Figure 3A:
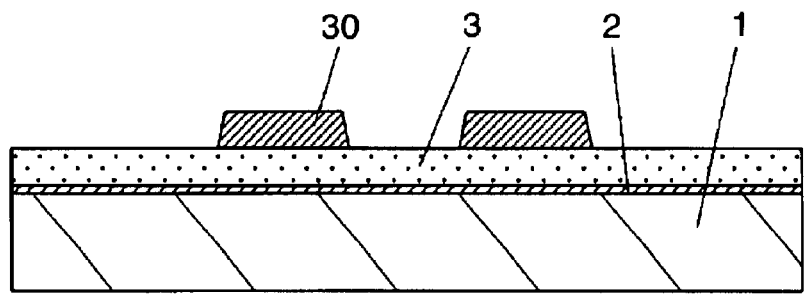
FIG. 3A to FIG. 3D are explanatory diagrams showing the main steps for film forming of the first piezoelectric thin film 3, the first main electrode layer 2, and the first opposed electrode layer 4, and for finishing them into specified shapes, on the first substrate.

First, the description is given by using FIG. 3A to FIG. 3D with respect to film forming and finishing on the first substrate. FIG. 3A shows a state in that the first main electrode layer 2 and the first piezoelectric thin film 3 are laminated on the first substrate 1, and the first piezoelectric pattern resist 30 is formed for finishing the first piezoelectric thin film 3 into the shape shown in FIG. 1.

To obtain the first piezoelectric thin film 3 having good piezoelectric characteristics, it is preferable, for example, using magnesium oxide mono-crystalline substrate (MgO substrate) as the first substrate 1, to form a C-axis oriented platinum layer (Pt layer) as the first main electrode layer 2 by way of sputtering on the MgO substrate and to form a lead zirconate titanate (PZT) layer on the Pt layer by way of sputtering. When the PZT layer is formed, a vertically oriented PZT layer may be obtained by setting the temperature of MgO substrate to about 600° C.

As the first substrate 1, besides MgO substrate, it is possible to employ strontium titanate substrate, saphire substrate or silicon mono-crystalline substrate (Si substrate). Also, as the first main electrode layer 2, it is possible to employ one selected from the group consisting of platinum (Pt), gold (Au), iridium (Ir), rhodium (Rh), ruthenium (Ru), silver (Ag), rhenium (Re), molybdenum (Mo), tantalum (Ta), and palladium (Pd), or its oxide. Further, it is possible to employ a multi-layer configuration including these metals. It is preferable to form a piezoelectric layer such as PZT or lead lanthanate zirconate titanate (PLZT) on the first main electrode layer 2 made from a material selected from these metals and to obtain piezoelectric characteristics through heat treatment executed thereafter.

The first piezoelectric thin film 3 is etched, using the first piezoelectric pattern resist 30 as a mask. Dry etching or wet etching can be executed as the etching operation. Particularly, wet etching is advantageous in terms of mass-productivity because the device is simple and capable of finishing the etching operation in a short time. When a PZT layer is processed by wet etching, it is preferable to use a mixed solution of hydrofluoric acid and nitric acid, a mixed solution of hydrofluoric acid, nitric acid and acetic acid, or these mixed solutions diluted with pure water. Since the first piezoelectric thin film 3 is about 3 μm in thickness, the sectional shape after dry etching or wet etching is generally trapezoidal. However, in this process, since only the first piezoelectric thin film 3 is etched, the etching operation can be easily controlled and it is possible to lessen the side etching and to greatly improve the shape reproducibility.

Figure 3B:
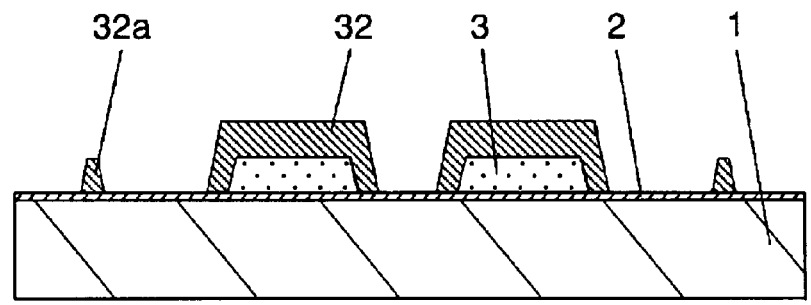

In this way, after etching the first piezoelectric thin film 3, first lower electrode pattern resist 32 is formed by photolithography process as shown in FIG. 3B in order to finish the first main electrode layer 2 into the specified shape. At the time, first marker resist 32a is also formed for positioning the patterns to each other which are formed on the first substrate 1 and the second substrate 11. However, the marker 32a is not formed sometimes in case the positioning is executed by other method. The first main electrode layer 2 must be exposed from the first piezoelectric thin film 3 in order to use a part of it as the connecting electrode pad 28. Therefore, it is necessary to make the first main electrode layer 2 different in shape from the first piezoelectric thin film 3. Also, to achieve such purpose that a part of the first piezoelectric thin film 3 exposed to the chemical solution used for removing the first substrate 1 is not etched, it is one of the effective means to make the first main electrode layer 2 a little wider than the first piezoelectric thin film 3. From such point of view, the first electrode pattern resist 32 is larger than the first piezoelectric thin film 3 as a whole, and as shown in FIG. 1 and FIG. 2, the pattern shape is formed in such manner that the portion functioning as the connecting electrode pad 28 is sufficiently exposed from the first piezoelectric thin film 3.

Figure 3C:
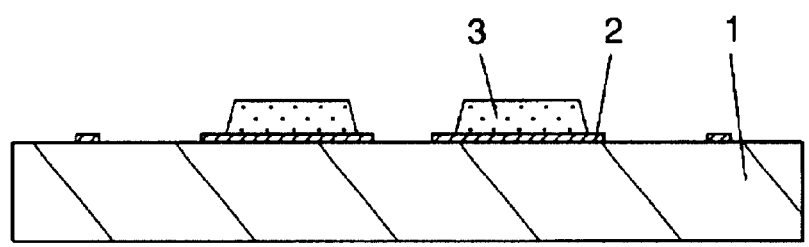

The shape of the first main electrode layer 2 etched by using the first lower layer electrode pattern resist 32 as a mask is shown in FIG. 3C. When the first main electrode layer 2 is etched, since the layer is thinner than the piezoelectric thin film, there is no particular problems in either dry etching or wet etching and it is possible to freely make the selection in accordance with the material for the electrode layer.

Figure 3D:
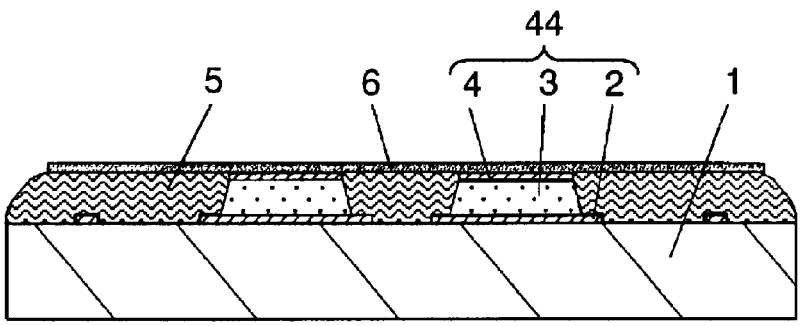

Next, as shown in FIG. 3D, first thin film pattern 44 is manufactured by forming the first opposed electrode layer 4 on the first piezoelectric thin film 3. Further, the insulating resin layer 5 is formed in nearly same thickness as the height up to the first opposed electrode layer 4. As the first opposed electrode layer 4, it is preferable to use a material same as for the first main electrode layer 2, or to use a single metal layer such as nichrome (NiCr), tantalum (Ta) or chrome (Cr), or to use a configuration with a material such as Pt, Au, Ag or Cu laminated on these materials.

Also, as the insulating resin layer 5, it is preferable to use a polyamide layer prepared by, for example, coating liquid polyamde with spinner and heating it at about 350° C. after drying, and also, to use a layer formed by heating and hardening after applying organic resin thereto. As is obvious from FIG. 3D, since the insulating resin layer 5 comes into contact with each of the first main electrode layer 2, the first piezoelectric thin film 3 and the first opposed electrode layer 4, it is required to have adequate electric insulation property and also to be a material that can be etched. Also, there arises no particular problem even in case the insulating resin layer 5 is partially formed on the second opposed electrode layer 14 as well.

The adhesive layer 6 is formed over the entire surface including the insulating resin layer 5 and the first opposed electrode layer 4, thereby completing the necessary processing operation on the first substrate 1. For the adhesive layer 6, it is preferable to use a material that is free from viscoelasticity after bonding, and to use an organic or inorganic adhesive agent generally employed. It is also possible to use an organic resin or a photo resist having adhesive property.

Next, the steps of film forming of the second piezoelectric thin film 13, the second main electrode layer 12, and the second opposed electrode layer 14 and finishing them into specified shapes on the second substrate will be described with reference to FIG. 4A to FIG. 4D.

Figure 4A:
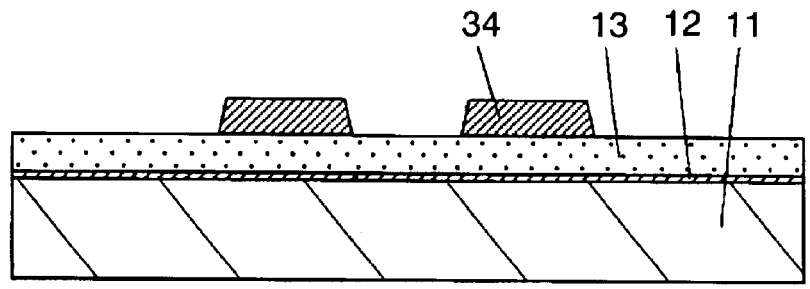
FIG. 4A to FIG. 4D are explanatory diagrams showing the main steps for film forming and finishing into specified shapes similarly on the second substrate.

FIG. 4A shows the second piezoelectric pattern resist 34 formed for finishing the second piezoelectric thin film 13 into the specified shape after laminating the second main electrode layer 12 and second piezoelectric thin film 13 on the second substrate 11 the same as in FIG. 3A. The second substrate 11, second main electrode layer 12, and second piezoelectric thin film 13 may be formed by using same film forming method as for materials similar to the first substrate 1, first main electrode 2 and first piezoelectric thin film 3 shown in FIG. 3A. Further, the second piezoelectric pattern resist 34 is same in shape as the first piezoelectric pattern resist 30. Also, the second piezoelectric thin film 13 is etched by the same method as for the first piezoelectric thin film 3. As a result, the first piezoelectric thin film 3 and the second piezoelectric thin film 13 can be formed into nearly same shape.

Figure 4B:
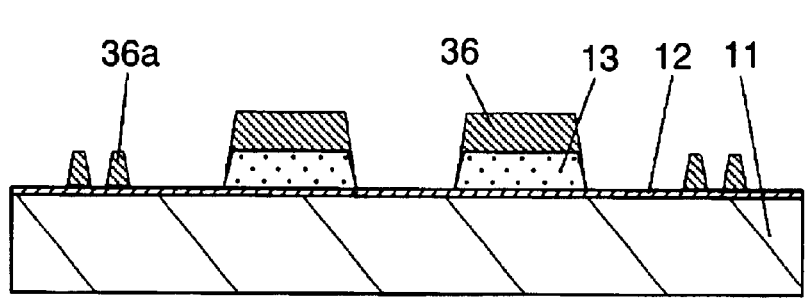
Figure 4C:
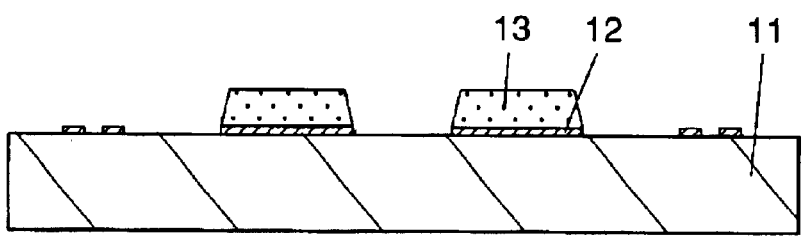

After finishing the second piezoelectric thin film 13 into the specified shape, the second main electrode layer 12 is finished by photolithography and etching process. A state of second lower electrode pattern resist 36 formed for achieving the purpose is shown in FIG. 4B. Also, the shape after etching is shown in FIG. 4C. The second lower electrode pattern resist 36, as is obvious in FIG. 4B, is nearly same or a little larger in shape as compared with the second piezoelectric thin film 13. Due to such a shape, it becomes easier to protect the second piezoelectric thin film 13 from the chemical solution used when the second substrate 11 is removed by wet etching. Also, second marker resist 36a is formed in order to manufacture a marker for positioning the first substrate 1 and the second substrate 11 opposed to each other.

When positioning of the first substrate 1 and the second substrate 11 is executed without using the marker 36a, it is preferable to use the second piezoelectric pattern resist 34 as it is for etching the second main electrode layer 12.

The finishing operations on the second substrate 11 shown in FIG. 4A to FIG. 4C differ from those on the first substrate 1 in that the second main electrode layer 12 and the second piezoelectric thin film 13 are nearly same in shape as described above and also the shape is nearly identical with that of the first piezoelectric thin film 3. Also, when a marker is used for positioning, the marker formed on the second substrate 11 is naturally different in shape from that formed on the first substrate 1.

Figure 4D:
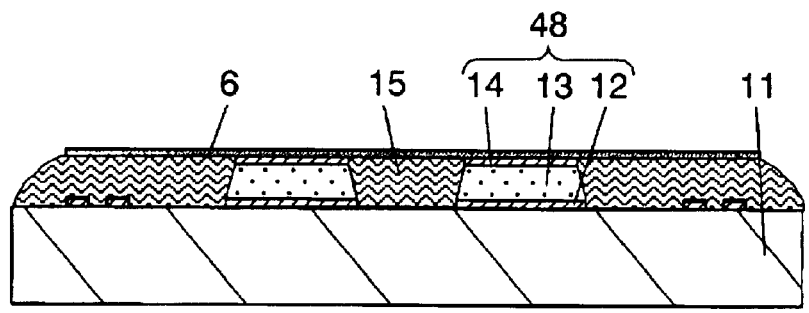

The second opposed electrode layer 14 is formed on the second piezoelectric thin film 13 in order to manufacture the second thin film pattern 48. After that, the insulating resin layer 15 is formed on the second substrate 11 the same as in FIG. 3D, and further, the adhesive layer 6 is formed over the entire surface including these. It is shown in FIG. 4D. Thus, the necessary finishing operations on the second substrate 11 are completed.

Figure 5A:
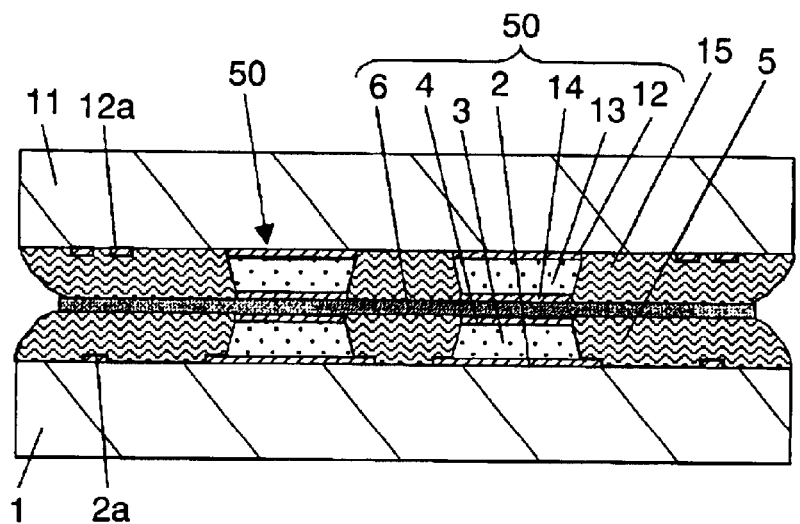
FIG. 5A is an explanatory diagram showing the first thin film pattern and the second thin film pattern opposed and bonded to each other by the manufacturing method in the preferred embodiment.
Figure 6A:
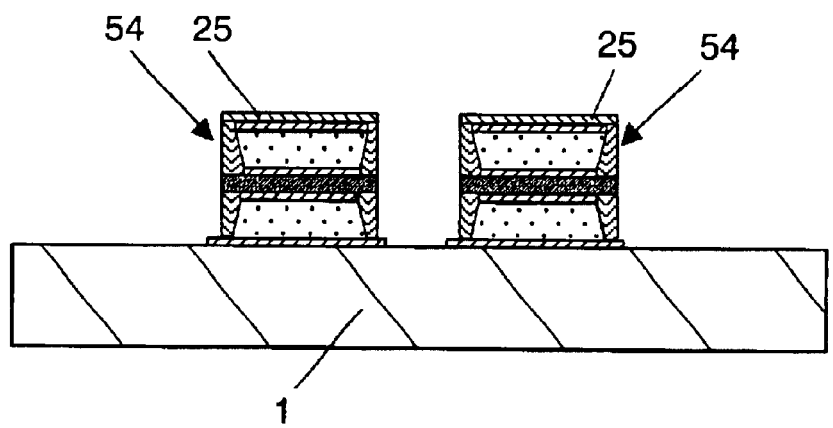
FIG. 6A is an explanatory diagram showing the thin film piezoelectric element completed on the first substrate by the manufacturing method in the preferred embodiment.
Figure 6B:
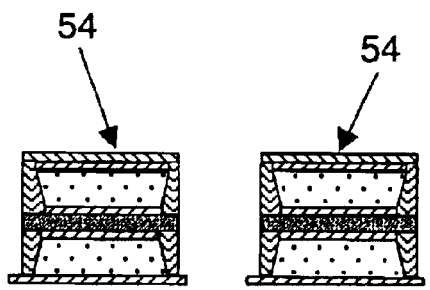
FIG. 6B is an explanatory diagram showing the thin film piezoelectric element separated by selectively removing the first substrate by the manufacturing method in the preferred embodiment.

The steps of manufacturing a thin film piezoelectric element by positioning between the adhesive layers 6, using a substrate shown in FIG. 3D and FIG. 4D, will be described with reference to FIG. 5A and FIG. 6B. FIG. 5A shows the first thin film pattern 44 and second thin film pattern 48 opposed and bonded to each other by the adhesive layers 6, using a substrate shown in FIG. 3D and FIG. 4D. At the time, the adhesive layers 6 are integrated to become a single layer, that is, adhesive layer 6. In this bonding operation, positioning is executed by using markers 12a and 2a so that the piezoelectric thin films are accurately placed one upon another. It is also preferable to form the adhesive 6 only on one of the substrates according to the type of adhesive agent used.

When a MgO substrate is used as the first substrate 1 and the second substrate 11, a microscope can be used for positioning because the substrate is transparent. In the case of a transparent substrate, it is possible, for example, to use a positioning method in which a mirror is first fixed in a predetermined position and, after positioning the mirror, the mirror is removed and the substrates are shifted closer to each other before bonding by the adhesive layer 6. Also, positioning can be executed on the basis of the shape of the piezoelectric thin film without using any marker at all. In this way, piezoelectric thin film held between the upper and lower electrode layers is laminated and integrated by adhesive layer 6, and thereby, a plurality of structures 50 are manufactured. In the present exemplary embodiment, two pieces of the structures 50 are used as a pair, which is called a paired structure.

Figure 5B:
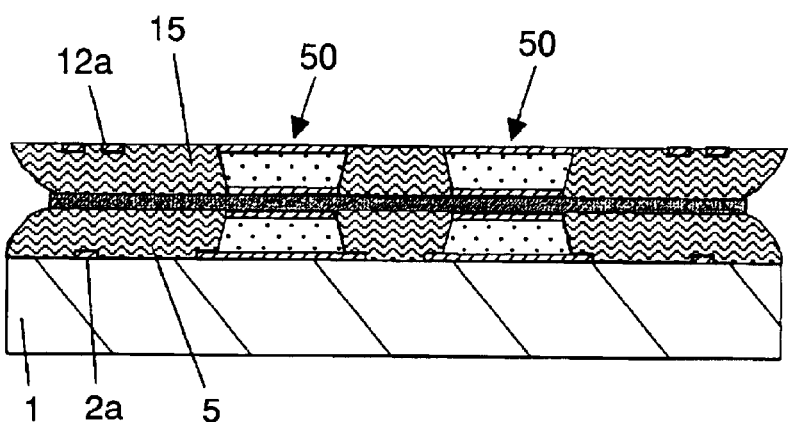
FIG. 5B is an explanatory diagram showing the second substrate selectively removed by the manufacturing method in the preferred embodiment.

After forming a shape with a plurality of structures 50 surrounded by insulating resin layers 5, 15, only the second substrate 11 is selectively removed as shown in FIG. 5B. As the substrate removing method, etching, polishing, or etching after polishing to a specified thickness can be executed.

Figure 5C:
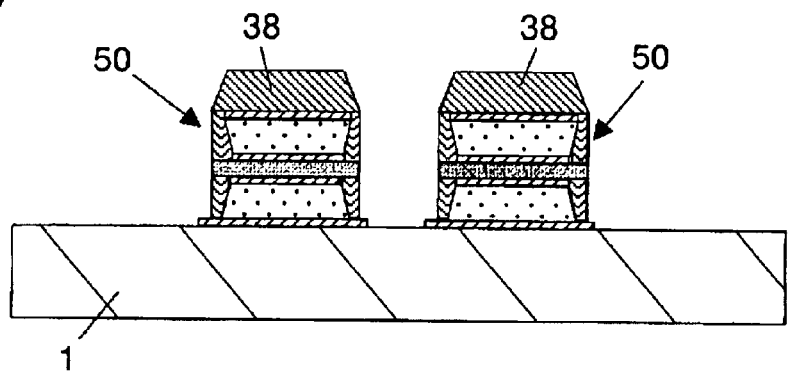
FIG. 5C is an explanatory diagram showing the insulating resin layer and adhesive layer etched into specified shapes by the manufacturing method in the preferred embodiment.

After removing the second substrate 11, the insulating resin layers 5, 15 and the adhesive layer 6 are etched in order to separate the plurality of structures 50 combined by the insulating resin layers 5, 15. FIG. 5C shows a state of the insulating resin layers 5, 15 and the adhesive layer 6 etched after forming the insulating resin layer pattern resist 38. When the insulating resin layers 5, 15 and the adhesive layer 6 are etched, a via-hole is also formed at the position shown in FIG. 1 and FIG. 2.

Next, the insulating resin layer pattern resist 38 is removed and the insulating layer 25 and connecting electrode layer (not shown) are formed on the second main electrode layer 12 including the portion of via-hole (not shown), followed by etching these into specified shapes to manufacture a connecting electrode pad (not shown), then thin film piezoelectric element 54 having a shape as shown in FIG. 1 and FIG. 2 is completed. The thin film piezoelectric element 54 in a state of being completed on the first substrate 1 is shown in FIG. 6A.

After coating the surface of the thin film piezoelectric element 54 thus formed with wax or other resin (not shown) for the purpose of protection, the first substrate 1 is removed by etching. Further, by dissolving and removing the wax or other resin sticking to the surface of the thin film piezoelectric element 54, it is possible to obtain the thin film piezoelectric element 54 in the form of being completely separated from the first substrate 1 and the second substrate 11.

In the manufacturing method in the present exemplary embodiment, since the insulating resin layer is formed in a state with the first thin film pattern and the second thin film pattern already formed, it is easy to check for defects such as bubbles and dust generated in the insulating resin layer and to precisely protect the structure. Further, according to the manufacturing method in the present exemplary embodiment, since piezoelectric thin films 3, 13, main electrode layers 2, 12, and opposed electrode layers 4, 14 formed on each of the substrates 1, 11 are etched into specified shapes at the time when they are respectively formed on the substrates 1, 11, it is possible to make the patterns on the substrates 1, 11 identical in shape with each other. Accordingly, even after laminating, it is possible to make the piezoelectric thin films 3, 13 same in shape. That is, the thin film piezoelectric element 54 has a sectional shape such that the piezoelectric thin films 3, 13 are respectively tapered, diminishing in width, from the main electrode layers 2, 12 to the opposed electrode layers 4, 14, and the opposed electrode layers 4, 14 are bonded to each other, and also, the insulating resin layers 5, 15 are thick at the portion close to the adhesive layer 6. Further, the shapes are nearly symmetrical with respect to the surface bonded by the adhesive layer 6. Consequently, when a voltage is equally applied to the first piezoelectric thin film 3 and the second piezoelectric thin film 13, the strength of electric field applied to each of the piezoelectric thin film 3, 13 is identical. Accordingly, the piezoelectric thin films 3, 13 are same in the amount of displacement, causing no deformation due to bending or the like, and it becomes possible to allow only the generation of expansion and contraction, thereby realizing highly accurate actuator operation.

Further, since the piezoelectric thin films 3, 13 and main electrode layers 2, 12 can be made into specified shapes by wet etching, there is no problem of foreign matter sticking to the side walls that often takes place in dry etching, and a trouble due to shorting between electrodes may be prevented. From this point of view, according to the manufacturing method in the present exemplary embodiment, it is possible to prevent the variation of piezoelectric characteristics due to the difference in shape of the piezoelectric thin films 3, 13 and the generation of electrical shorting trouble between electrodes, thereby enabling the manufacture of highly reliable thin film piezoelectric element 54.

In the present exemplary embodiment, the insulating resin layers 5, 15 and the adhesive layer 6 are separately formed by using different materials, but it is also preferable to form insulating resin layers having adhesive property on at least one surface of the first substrate and the second substrate before positioning and bonding the first thin film pattern and the second thin film pattern to each other.

Second Exemplary Embodiment

FIG. 7A to FIG. 8C are explanatory diagrams for describing the manufacturing steps in the manufacturing method in the second exemplary embodiment. An example of a pair of thin film piezoelectric elements used as an actuator as shown in FIG. 1 and FIG. 2 also in the manufacturing method in the present exemplary embodiment will be described.

Figure 7A:
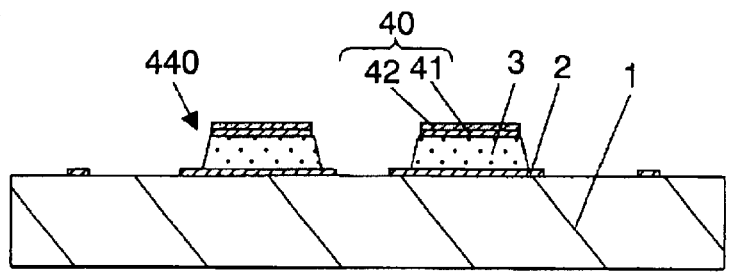
FIG. 7A is an explanatory diagram showing the first thin film pattern formed on the first substrate by the manufacturing method in the second preferred embodiment of the present invention.
Figure 7B:
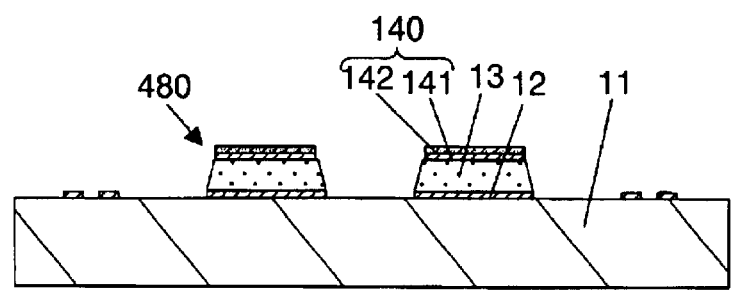
FIG. 7B is an explanatory diagram showing the second thin film pattern formed on the second substrate by the manufacturing method in the preferred embodiment.

FIG. 7A shows a state of first thin film pattern 440 manufactured by forming the first opposed electrode layer 40 after etching the first main electrode layer 2 and the first piezoelectric thin film 3, formed on the first substrate 1, into specified shapes the same as in the manufacturing method in the first exemplary embodiment. The first opposed electrode layer 40 is made up of two layers of first lower layer 41 and first upper layer 42. Also, FIG. 7B shows a state of second thin film pattern 480 manufactured by forming the second opposed electrode layer 140 after etching the second main electrode layer 12 and the second piezoelectric thin film 13, formed on the second substrate 11, into specified shapes in the same way. The second opposed electrode layer 140 is also made up of two layers of second lower layer 141 and second upper layer 142. As is apparent from FIG. 7A and FIG. 7B, also in the present exemplary embodiment, regarding the first main electrode layer 2, the second main electrode layers 12, the first piezoelectric thin film 3, the second piezoelectric thin film 13, the first opposed electrode layer, and the second opposed electrode layer, it is possible to employ a film forming method, photo lithography and etching process same as those described in the first exemplary embodiment. Accordingly, the description of these are omitted here.

In the present exemplary embodiment, the first opposed electrode layer 40 and the second opposed electrode layer 140 are of a two-layer structure, and the materials for the first upper layer 42 and the second upper layer 142 disposed respectively at the surface sides thereof are characterized by such combination that one is An, Ag or Cu, and the other is Sn or Cd. As for the first lower layer 41 and the second lower layer 141, there is no particular restriction provided that the layers are adhesive to each of the piezoelectric thin films and the thin films using the materials mention above. For example, the materials described in the first exemplary embodiment may be employed. Also, as the first opposed electrode layer 40 and the second opposed electrode layer 140 in the present exemplary embodiment, only needed is to combine the first upper layer 42 and the second upper layer 142 at the surface sides with the materials mentioned above, and the structure is not limited to a two-layer structure as mentioned above, but it is possible to employ a three-layer structure or a four-layer structure as needed. Also, the materials for the first upper layer 42 and the second upper layer 142 are not limited to the combination of materials mentioned above provided that the material combination is capable of metal bonding at temperatures lower than 400° C.

Figure 7C:
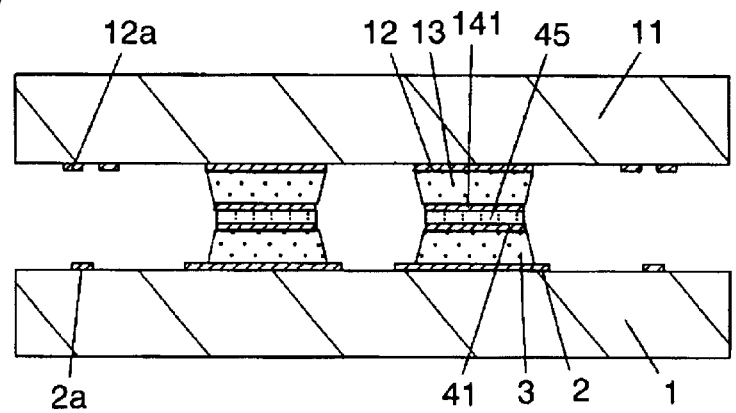
FIG. 7C is an explanatory diagram showing the first thin film pattern and the second thin film pattern opposed and bonded to each other by the manufacturing method in the preferred embodiment.

With the first upper layer 42 and the second upper layer 142 making the opposed electrode layers having the above material configuration in contact with each other and heated, the first upper layer 42 and the second upper layer 142 are alloyed and bonded with each other. For example, using Au for the first upper layer 42, and Sn for the second upper layer 142, when these are heated at about 280° C. or over after cleaning the surfaces, then a eutectic reaction takes place between Au and Sn, which will then become an integrated metal bonding layer 45. A state of metals bonded in this way is shown in FIG. 7C. Incidentally, during the bonding operation, markers 12a, 2a are used for positioning the same as in the first exemplary embodiment.

Figure 7D:
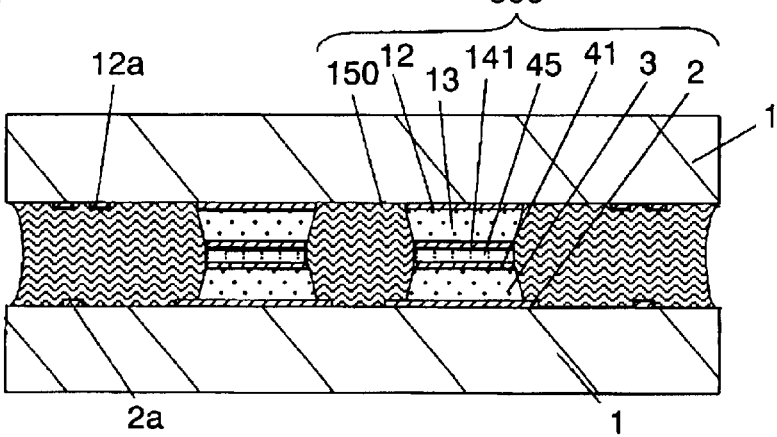
FIG. 7D is an explanatory diagram showing the insulating resin layer formed with insulating resin filled by the manufacturing method in the preferred embodiment.

Thus, a configuration including one region where two piezoelectric thin films are bonded between the first substrate 1 and the second substrate 11 and the other region of space. The space region is filled with resin to form insulating resin layer 150. A state of the insulating resin layer 150 filled is shown in FIG. 7D. Including the first main electrode layer 2, the first piezoelectric thin film 3, the first upper layer 41 of the first opposed electrode layer 40, the metal bonding layer 45, the second main electrode layer 12, the second piezoelectric thin film 13, and the second lower layer 141 of the second opposed electrode layer 140, with specified patterns formed thereon, a plurality of structures 500 are manufactured the same as in the first exemplary embodiment.

Since the structure 500 is about 10 μm in thickness, it is necessary to fill resin into the space region of about 10 μm thick between two substrates, and the purpose can be achieved by properly selecting the viscosity of the resin that enables the penetration by capillary phenomenon. Also, it is preferable to use a way of forcible penetration by sucking up the resin from one side.

With the insulating resin layer 150 filled in, the peripheral portion of the structure 500, except the portion contacting with each substrate of the first main electrode layer 2 and the second main electrode layer 12, is covered with only the insulating resin layer 150. After that, the second substrate 11 is removed by etching. Since the structure 500 is completely protected with the insulating resin layer 150, the etching solution will not reach the structure 500, and therefore, the structure 500 is not affected by the etching solution. Also as to the method of removing the second substrate 11 by etching, the same method as described in the first exemplary embodiment may be employed.

Figure 8A:
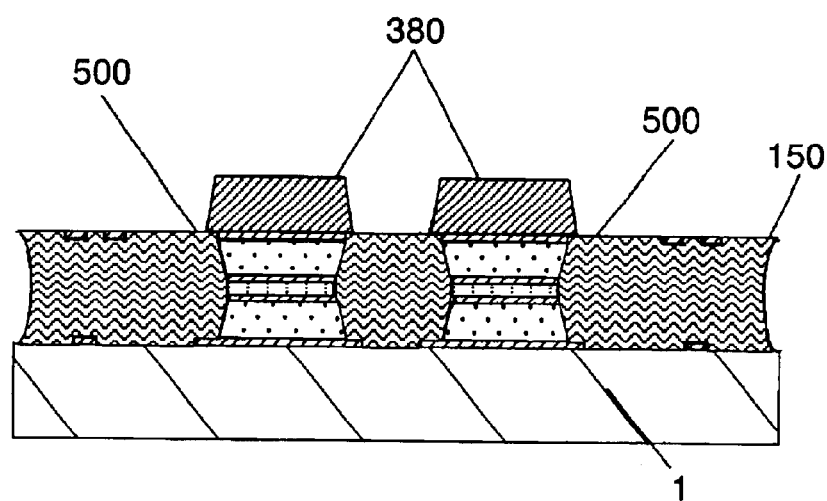
FIG. 8A is an explanatory diagram showing the resist for insulating resin layer pattern for etching the insulating resin layer by the manufacturing method in the preferred embodiment.

With the second substrate 11 removed, a plurality of structures 500 are exposed in a state of being combined by the insulating resin layer 150. Subsequently, the insulating resin layer 150 is etched to separate the plurality of structures 500. At the same time, a via-hole (not shown) and connecting electrode layer (not shown) are formed for the connection from each structure 500 to external equipment (not shown). FIG. 8A shows a state of insulating resin layer pattern resist 380 formed for etching the insulating resin layer 150. The insulating resin layer pattern resist 380 is formed wider than at least the first piezoelectric thin film 3, the first lower layer 41 of the first opposed electrode layer 40, the metal bonding layer 45, the second lower layer 141 of the second opposed electrode layer 140, and the second piezoelectric thin film 13. By forming such pattern, each of the structures 500 can be separated by etching only the insulating resin layer 150, and thereby, the etching conditions are simplified. Also, with such shape formed, since the electrode layer and piezoelectric thin film are protected by the insulating resin layer even in a state of being completed, it ensures excellent moisture resistance and is free from deterioration of piezoelectric characteristics even when used as a thin film piezoelectric element.

Figure 8B:
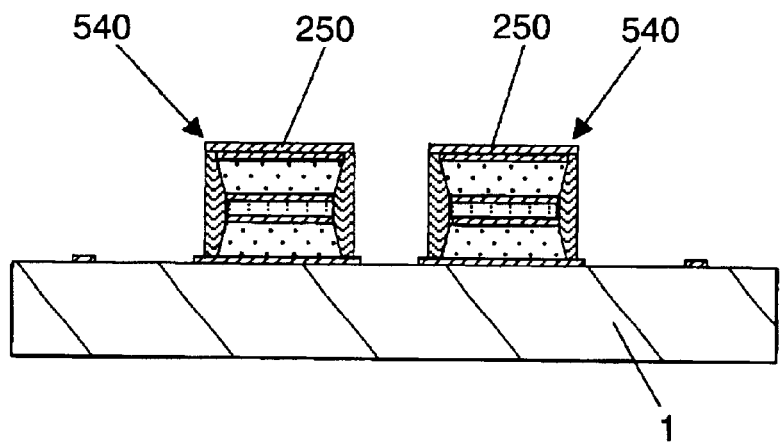
FIG. 8B is an explanatory diagram showing the thin film piezoelectric element completed on the first substrate by the manufacturing method in the preferred embodiment.

FIG. 8B shows a state of thin film piezoelectric element 540 formed on the first substrate 1 through the steps of removing the insulating resin layer 150 by etching, making a via-hole (not shown), forming and finishing insulating layer 250 and connecting electrode layer (not shown). It is preferable to finish the via-hole at the same time when etching the insulating resin layer 150, and also preferable to perform the etching of the insulating resin layer 150 and the via-hole separately. As for the method of forming a connecting electrode pad (not shown) by forming a connecting electrode layer (not shown), after forming and finishing into specified shapes of the insulating layer 250 on the side portion of via-hole and on the second main electrode layer 12, it is possible to execute the manufacture by the same steps as in the first exemplary embodiment. The thin film piezoelectric element 540 manufactured is different from the thin film piezoelectric element 54 in the first exemplary embodiment shown in FIG. 1 and FIG. 2 only in that the adhesive layer 6 is metal bonding layer 45, and there is no difference between the two with respect to via-hole finishing and shape.

Figure 8C:
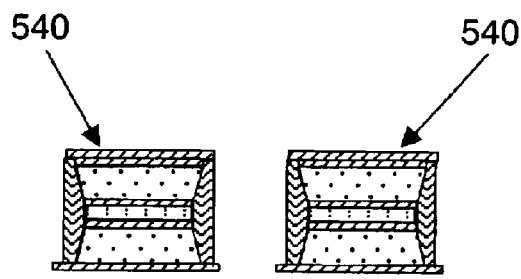
FIG. 8C is an explanatory diagram showing the thin film piezoelectric element separated by selectively removing the first substrate by the manufacturing method in the preferred embodiment.

After protecting the surface of the thin film piezoelectric element 540 thus formed by means of resin (not shown) such as wax, the first substrate 1 is removed by etching and further wax or other resin sticking to the surface of the thin film piezoelectric element 540 is dissolved and eliminated, and thereby, the thin film piezoelectric element 540 completely separated from the substrate may be obtained. It is shown in FIG. 8C.

The section of the thin film piezoelectric element 540 thus manufactured has a sectional shape such that the piezoelectric thin films 3, 13 are respectively tapered, diminishing in width, from the main electrode layers 2, 12 to the opposed electrode layers 40, 140, and the opposed electrode layers 40, 140 are bonded to each other, and also, the insulating resin layer 150 is thick at the portion close to the metal bonding layer 45. Moreover, the shapes are nearly symmetrical with respect to the metal bonding layer 45. Accordingly, when a voltage is equally applied to the first piezoelectric thin film 3 and the second piezoelectric thin film 13, equal strength of electric field will be applied to each of the first piezoelectric thin film 3 and the second piezoelectric thin film 13, and it is possible to make the piezoelectric thin films 3, 13 same in the amount of displacement. Accordingly, only expansion and contraction may be simply realized without trouble such as deformation due to bending and the like.

Also, when the metal bonding layer 45 is formed, the metal is melted once and, therefore, self-matching alignment is then possible. Thus, even in case the positioning accuracy is not high in positioning the opposed electrode layers 40, 140 to each other, highly accurate positioning and bonding may be executed due to the self-alignment made at the time of melting.

Further, since the first thin film pattern and the second thin film pattern are bonded by alloying the opposed electrodes with each other, the first opposed electrode layer and the second opposed electrode layer may be electrically shorted, and thereby, the via-hole finishing process for taking connecting electrode pads out of these electrode layers can be simplified. Also, since the first thin film pattern and the second thin film pattern are bonded by a metal bonding method, it is possible to enhance the rigidity as a piezoelectric element and to lessen the variation in displacement. Also, this bonding can be executed without using any flux or the like, and therefore, defective bonding is hard to take place and there is no generation of gas during use. Further, the structure may be precisely protected by the insulating resin layer, and moreover, the finishing operation may be executed with good reproducibility because only needed is the etching of the insulating resin layer.

In the second exemplary embodiment, the first upper layer and the second upper layer formed on the surfaces of the opposed electrode layers 40, 140 are alloyed with each other for the bonding purpose, but it is also possible execute the positioning and bonding after forming an adhesive layer only on at least one surface of the first opposed electrode layer 40 and the second opposed electrode layer 140. Also in this case, since bonding by the adhesive layer takes place only between the first opposed electrode layer 40 and the second electrode layer 140, a configuration such that the structure 500 is covered with only the insulating resin layer 150 can be manufactured by pouring resin into the space region between the first substrate 1 and the second substrate 11. In the case of this method, the first thin film pattern and the second thin film pattern are bonded by the adhesive layer formed only on the opposed electrode layer, and the structure formed can be protected only by the insulating resin layer that is a single material. Also, the freedom of material selection will be increased with respect to the first opposed electrode layer and the second opposed electrode layer. Further, it is possible to lower the heating temperature for bonding or to execute the bonding at normal temperatures, enabling the suppression of deterioration in characteristics of the piezoelectric thin film.

Also, in the first exemplary embodiment and the second exemplary embodiment, the opposed electrode layer is formed after forming the main electrode layer and piezoelectric thin film on the first substrate and the second substrate, followed by finishing them into specified shapes, but it is also preferable to employ a method in that the main electrode layer, piezoelectric thin film and opposed electrode layer are first formed and then finished into specified shapes.

In the first exemplary embodiment and the second exemplary embodiment, an actuator using two pieces of thin film piezoelectric elements as a pair has been described, but the present invention is not limited to this. Even in case of using one or three or more actuators, a similar method may be employed for the manufacture. Also, not only in the case of using the element as an actuator, but also in the case of using it as a piezoelectric sensor, it is possible to employ a similar manufacturing method and structure.

Third Exemplary Embodiment

The manufacturing method for thin film piezoelectric elements in the third exemplary embodiment, as compared with the first exemplary embodiment and the second exemplary embodiment, is slightly different with respect the method of film forming and etching on the first substrate and the second substrate. That is, the first main electrode layer, the first piezoelectric thin film, and the first opposed electrode layer are laminated and formed on the first substrate in this order. After that, the first opposed electrode layer and the first piezoelectric thin film are all together finished into specified shapes by photolithography and etching process. Subsequently, at least a part of the first main electrode layer is finished by etching into a shape larger than the first piezoelectric thin film and the first opposed electrode layer. In this way, a plurality of first thin film patterns are formed on the first substrate, and the first thin film pattern then formed is identical in shape to the first exemplary embodiment and the second exemplary embodiment.

Also, the second main electrode layer, the second piezoelectric thin film, and the second opposed electrode layer are laminated and formed on the second substrate in this order. After that, these layers are finished by etching into nearly same shapes as for the first piezoelectric thin film in order to form a plurality of second thin film patterns on the second substrate. The steps thereafter are same as in the first exemplary embodiment and the second exemplary embodiment, and therefore, the description is omitted here.

In this manufacturing method, since the main electrode layer, the piezoelectric thin film and the opposed electrode layer are continuously formed on each of the substrates and then finished into specified shapes, it is possible to precisely prevent the positional deflection of patterns between the opposed electrode layer and piezoelectric thin film in particular. Also, the main electrode layer, piezoelectric thin film, and opposed electrode layer can be continuously formed, making it possible to realize efficient film forming on a continuous film forming apparatus. Further, since these thin film shapes are finished every substrate, it is possible to obtain shapes with good reproducibility by either of wet etching and dry etching as described above.

Fourth Exemplary Embodiment

The manufacturing method for thin film piezoelectric elements in the fourth exemplary embodiment is such that an insulating resin layer is formed by using a resin material having adhesive property on at least one surface of the first substrate surface including the first thin film pattern of the first substrate and the second substrate surface including the second thin film pattern of the second substrate. By using such material, the bonding of the first thin film pattern and the second thin film pattern to each other and the forming of the insulating resin layer can be simultaneously executed with use of same material. Accordingly, the operational efficiency can be greatly improved. Also, in the form of a thin film piezoelectric element, no adhesive layer having different quality is placed between the insulating resin layers as is done in the first exemplary embodiment, making it completely monolayer, and it is possible to improve the characteristics as a protective layer and to execute the etching operation with good reproducibility.

What is claimed is:

1. A manufacturing method for thin film piezoelectric elements, comprising:

forming a plurality of first thin film patterns on a first substrate, wherein a first piezoelectric thin film is hold between a first main electrode layer and a first opposed electrode layer on said first substrate, and at leant a part of said first main electrode layer disposed at said first substrate side is larger in shape than said first piezoelectric thin film and said first opposed electrode layer;

forming a plurality of second thin film patterns on a second substrate, wherein a second piezoelectric thin film is held between a second main electrode layer and a second opposed electrode layer on said second substrate, and said second piezoelectric thin film, said second main electrode layer, and said second opposed electrode layer are substantially same in shape as said first piezoelectric thin film;

forming a plurality of structures, integrated by bonding said first thin film pattern and said second thin film pattern opposed and positioned to each other no as to be placed one upon another, and an insulating resin layer for protecting amid structures;

selectively removing only amid second substrate in order to expose said plurality of structures protected by said insulating resin layer;

etching said insulating resin layer into a shape that covers a peripheral portion of said structure except a part of said first main electrode layer;

forming a connecting electrode pad for connecting said first main electrode layer, said first opposed electrode layer, said second main electrode layer, and said second opposed electrode layer to external equipment; and selectively removing only said first substrate.

2. The manufacturing method for thin film piezoelectric elements of claim 1, wherein the process of forming said plurality of first thin film patterns on said first substrate, and the process of forming said plurality of second thin film patterns on said second substrate further comprise:

forming said plurality of first thin film patterns on said first substrate, wherein said first opposed electrode layer is formed on said first piezoelectric thin film, after laminating said first main electrode layer and said first thin film on said first substrate, and finishing said at least a part of said first main electrode layer into said shape larger than said first piezoelectric thin film; and forming said plurality of second thin film pattern, on said second substrate, wherein said second opposed electrode layer is formed on said second piezoelectric thin film after laminating said second main electrode layer and said second piezoelectric thin film on said second substrate and finishing the second main electrode layer and said second piezoelectric thin film into said shape substantially identical as compared with said first piezoelectric thin film.

3. The manufacturing method for thin film piezoelectric element of claim 1, wherein the process of forming said plurality of first thin film patterns on said first substrate, and the process of forming said plurality of second thin film patterns on said second substrate further comprise:

forming said plurality of first thin film patterns on said first substrate, wherein said first main electrode layer, said first piezoelectric thin film, and said first opposed electrode layer are laminated on said first substrate in this order, and at least a part of said first main electrode layer is finished into said shape larger in shape than said first piezoelectric thin film and said first opposed electrode layer; and forming said plurality of second thin film patterns on said second substrate, wherein said second main electrode layer, said second piezoelectric thin film, and said second opposed electrode layer are laminated on said second substrate in this order, and said second main electrode layer, said second piezoelectric thins film, and said second opposed electrode layer are finished into said shape substantially identical as compared with said first piezoelectric thin film.

4. The manufacturing method for than film piezoelectric elements of claim 1, wherein the process of forming said plurality of structures and insulating resin layer for protecting said structures further comprising:

forming said insulating resin layer as having the same thickness as said first thin film pattern and said second thin film pattern respectively on said first substrate surface with said first thin film pattern on said first substrate formed thereon and on said second substrate surface with said second thin film pattern on said second substrate formed thereon; and forming an adhesive layer on at least one surface of said insulating resin layer surface and said first thin film pattern surface on said first substrate, and said insulating resin layer surface and said second thin film pattern surface on said second substrate, followed by opposing and positioning said first thin film pattern and said second thin film pattern to each other so as to be placed one upon another and bonding by said adhesive layer.

5. The manufacturing method for thin film piezoelectric elements of claim 1, wherein the process of forming said plurality of structures and insulating resin layer for protecting said structures further comprises:

forming said insulating resin layer with an adhesive property on at least one surface of said first substrate surface including said first thin film pattern on said first substrate, and said second substrate surface including said second thin film pattern on said second substrate, followed by bonding said first thin film pattern and said second thin film pattern opposed and positioned so as to be placed one upon another, simultaneously executing the forming and bonding of said insulating resin layer.

6. The manufacturing method for thin film piezoelectric elements of claim 1, wherein the process of forming said plurality of structures and insulating resin layer for protecting said structures further comprises:

opposing and positioning said first opposed electrode layer of said first thin film pattern and said second opposed electrode layer of said second thin film pattern to each other so as to be placed one upon another, and forming said plurality of structures by metal bonding between said first opposed electrode layer and said second opposed electrode layer; and forming said insulating resin layer by filling resin into a space region between said first substrate and said second substrate, which depends upon the thickness of said plurality of structures.

7. The manufacturing method for thin film piezoelectric elements of claim 1, wherein the process of forming said plurality of structures and insulating resin layer for protecting acid structures further comprises:

forming an adhesive layer on at least one layer of said first opposed electrode layer of said first thin film pattern and said second opposed electrode layer of said second thin film pattern;

opposing and positioning said first thin film pattern and said second thin film pattern to each other so as to be placed one upon another, and forming said plurality of structures by bonding said first opposes electrode layer and said second opposed electrode layer with the use of said adhesive layer; and forming said insulating resin layer by filling resin into a space region between said first substrate and said second substrates which depends upon the thickness of said plurality of structures.

8. The manufacturing method for chin film piezoelectric elements of claim 6, wherein said first opposed electrode layer of said first thin film pattern and said second opposed electrode layer of said second thin film pattern are respectively made up of a multi-layer structure, and the surface layer of one opposed electrode layer is a metal selected from the group consisting of gold (Au), silver (Ag), and copper (Cu), and the surface layer of the other opposed electrode layer is tin (Sn) or cadmium (Cd), which are handed by alloying the metal layers with each other disposed on the surface layers.

9. The manufacturing method for thin film piezoelectric elements of claim 7, wherein said adhesive layer has conductivity.

* * * * *

UNITED STATES PATENT AND TRADEMARK OFFICE
CERTIFICATE OF CORRECTION

PATENT NO. : 6,817,073 B2
DATED : November 16, 2004
INVENTOR(S) : Hirokazu Uchiyama et al.

It is certified that error appears in the above-identified patent and that said Letters Patent is hereby corrected as shown below:

Column 14,
Line 7, change "hold" to -- held --;
Line 23, change "no" to -- so --;
Line 26, change "amid" to -- said --;
Line 45, after "first" (second occurrence) insert -- piezoelectric --;
Line 49, change "pattern," to -- patterns, --;
Line 59, change "element" to -- elements --;

Column 15,
Line 11, change "thins" to -- thin --;

Column 16,
Line 17, change "acid" to -- said --;
Line 25, change "opposes" to -- opposed --;
Line 28, after "filling" insert -- a --;
Line 32, change "chin" to -- thin --; and
Line 40, change "handed" to -- bonded --.

Signed and Sealed this

Fifth Day of April, 2005

JON W. DUDAS
*Director of the United States Patent and Trademark Office*